(12) United States Patent
Chan

(10) Patent No.: US 8,537,629 B1
(45) Date of Patent: Sep. 17, 2013

(54) METHOD OF TESTING BITLINE IN NON-VOLATILE MEMORY DEVICE

(75) Inventor: Tony Chan, Chu-Pei (TW)

(73) Assignee: Eon Silicon Solution Inc. (TW)

( * ) Notice: Subject to any disclaimer, the term of this patent is extended or adjusted under 35 U.S.C. 154(b) by 0 days.

(21) Appl. No.: 13/540,700

(22) Filed: Jul. 3, 2012

(51) Int. Cl.
*G11C 7/00* (2006.01)

(52) U.S. Cl.
USPC .......................................................... 365/201

(58) Field of Classification Search
USPC .......................................................... 365/201
See application file for complete search history.

(56) References Cited

U.S. PATENT DOCUMENTS

| 5,276,400 A * | 1/1994 | Denyer et al. ............... 324/750.3 |
| 6,249,479 B1 * | 6/2001 | Tanzawa et al. .......... 365/230.06 |

* cited by examiner

*Primary Examiner* — Hoai V Ho
*Assistant Examiner* — Pablo Huerta
(74) *Attorney, Agent, or Firm* — Schmeiser, Olsen & Watts, LLP

(57) ABSTRACT

A method of testing bitlines in a non-volatile memory device is introduced. The non-volatile memory device includes a memory cell array and a plurality of bitlines crossing the memory cell array. Each of the bitlines has a first end and a second end. The bitlines are divided into a first group and a second group. The testing method includes applying a supply voltage (for charging) or a ground voltage (for discharging) to a specific group of bitlines. The bitlines are tested in two testing stages, namely an open-circuit bitline test and a short-circuit bitline test, based on the feature that a defective bitline cannot be charged or discharged. The open-circuit bitline test and the short-circuit bitline test are quick and dispense with a lengthy programmed/erasing process.

4 Claims, 3 Drawing Sheets

METHOD OF TESTING BITLINE IN NON-VOLATILE MEMORY DEVICE

FIELD OF TECHNOLOGY

The present invention relates to testing methods, and more particularly, to a method of testing bitlines in a non-volatile memory device.

BACKGROUND

Due to drawbacks of semiconductor process technology, a non-volatile memory device can be flawed with a severed bitline or a short circuit developed between two adjacent bitlines. For example, given the ever-decreasing dimensions of non-volatile memory devices, two adjacent bitlines are becoming closer to each other. A short circuit can develop during a manufacturing process, because a bitline contact window is likely to occur, and adjacent bitlines are excessively close to each other.

Therefore, at the end of the manufacturing process, non-volatile memory devices have to be tested in order to confirm that charge has been appropriately injected by a programmed operation into memory cells. Non-volatile memory devices are usually tested by a verification operation process to determine whether they are defective. However, the verification operation process is so lengthy and time-consuming that a defect has to be tested repeatedly in several instances before the defect can be confirmed.

SUMMARY

It is an objective of the present invention to provide a method of testing bitlines quickly.

In order to achieve the above and other objectives, the present invention provides a method of testing bitlines in a non-volatile memory device. The non-volatile memory device comprises a memory cell array and a plurality of bitlines crossing the memory cell array. The bitlines each have a first end and a second end. The bitlines are divided into a first group and a second group. The testing method comprises the steps of: supplying a supply voltage to the first group of bitlines from the first end of the bitlines to perform a charging process, and applying a ground voltage to the second group of bitlines; shutting down the charging process which is otherwise performed on the first group of bitlines, and applying the ground voltage to the bitlines from the second end thereof to perform a discharging process; identifying a status of each of the bitlines in the first group based on a voltage level of the first group of bitlines, wherein, if the voltage level of one of the bitlines in the first group is identified not the ground voltage, it will be determined that the bitline has an open-circuit defect; applying the supply voltage to the second group of bitlines from the second end of the bitlines to perform the charging process, and applying the ground voltage to the first group of bitlines from the first end of the bitlines to perform the discharging process; shutting down the discharging process which is otherwise performed on the first group of bitlines; and identifying the status of each of the bitlines in the first group based on a voltage level of the first group of bitlines, wherein, if the voltage level of the bitlines is identified not the ground voltage, it will be determined that the bitlines have developed a short circuit with the adjacent bitlines and have a short-circuit defect.

In an embodiment, the first group of bitlines is defined as including the odd-numbered bitlines and therefore the second group of bitlines is defined as including the even-numbered bitlines, and vice versa.

In an embodiment, the first end of the bitlines receives a voltage applied to a page buffer circuit of the non-volatile memory device, and a data as to whether the bitlines have an open-circuit defect is stored in the page buffer circuit.

In an embodiment, the testing method further comprises interchanging the first group of bitlines and the second group of bitlines during the steps of the testing method in order to finish testing all the bitlines.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION

Figure 1:
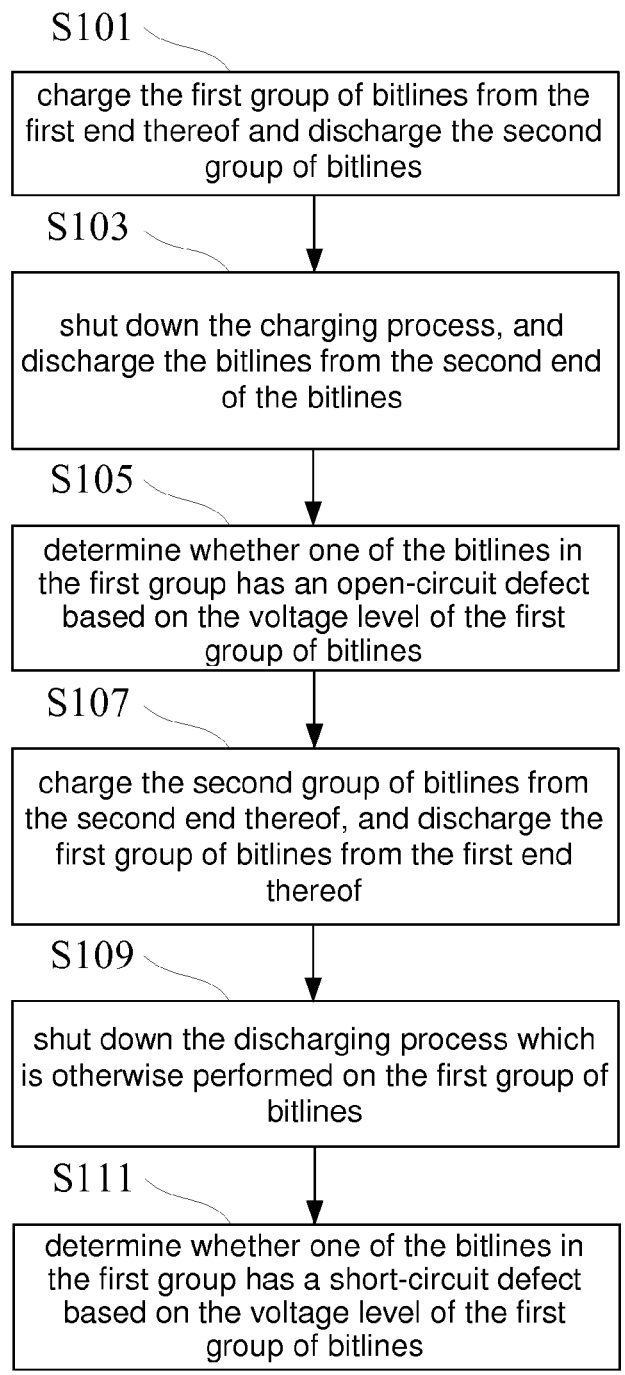
FIG. 1 is a flow chart of a method of testing a bitline according to an embodiment of the present invention.
Figure 2:
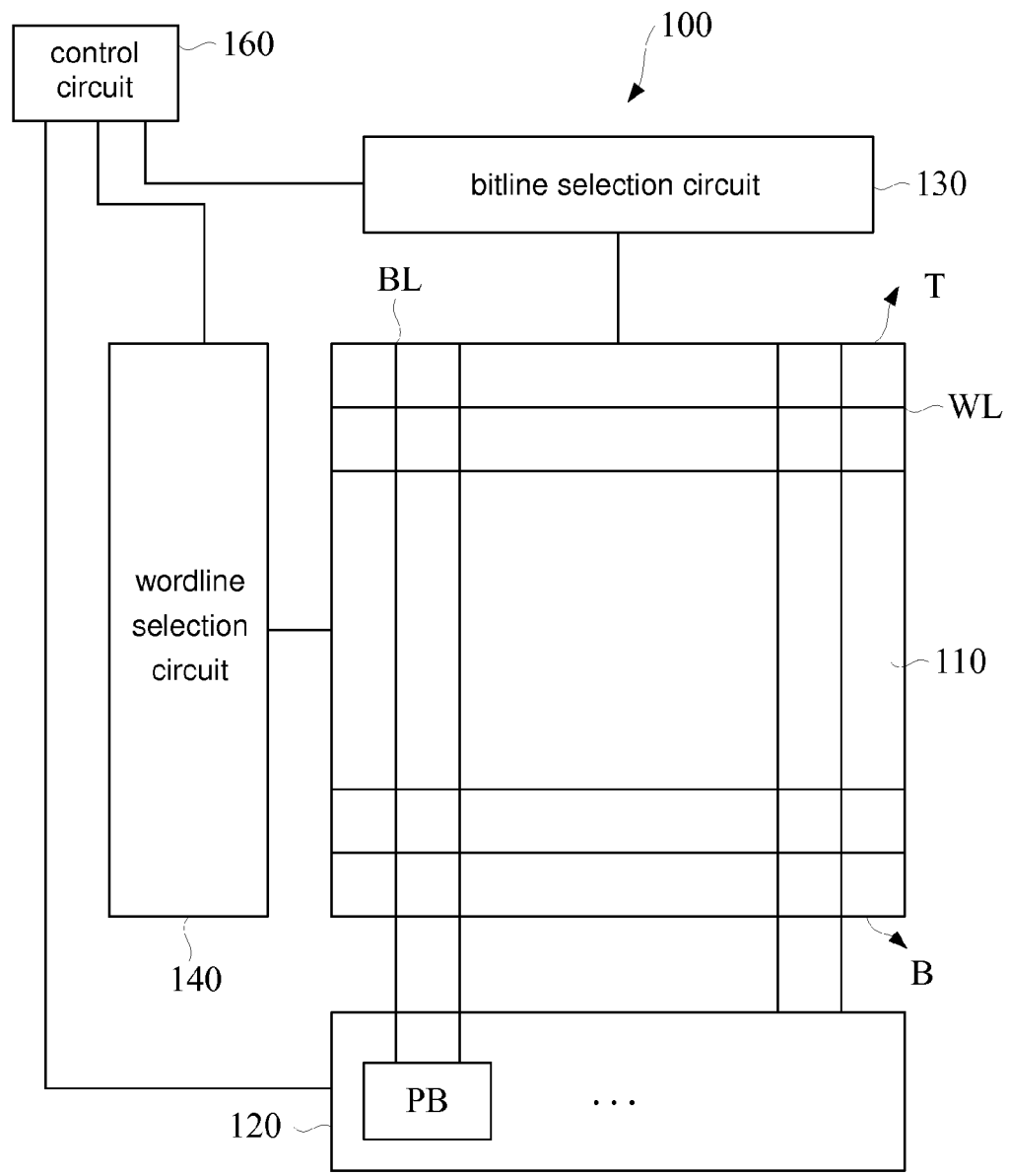
FIG. 2 is a block diagram of a non-volatile memory device.
Figure 3:
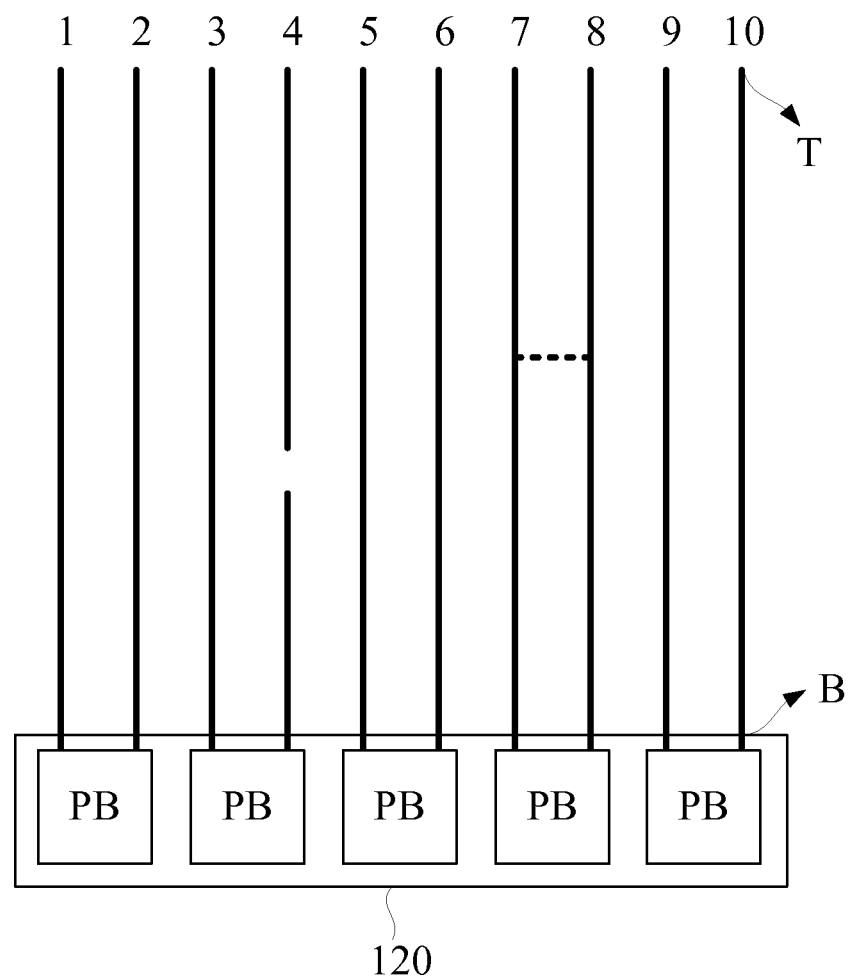
FIG. 3 is a schematic view of a bitline status according to an embodiment of the present invention.

Referring to FIG. 1, there is shown a flow chart of a method of testing a bitline according to an embodiment of the present invention. In an embodiment of the present invention, a non-volatile memory device comprises a memory cell array and a plurality of bitlines crossing the memory cell array. The plurality of bitlines is divided into two groups, namely the first group and the second group. Referring to FIG. 3, preferably, the bitlines are numbered in ascending order starting with one. The first group of bitlines is defined as including the odd-numbered bitlines and therefore the second group of bitlines is defined as including the even-numbered bitlines, and vice versa. Each of bitlines has two ends, namely the first end and the second end, for receiving and sending a signal, respectively. In an embodiment of the present invention, both the first end and the second end of a plurality of bitlines refer to the same direction. For example, the first end of a plurality of bitlines is equivalent to the lower end (B as shown in FIG. 2) of the memory cell array, and the second end of the bitlines is equivalent to the upper end (T as shown in FIG. 2) of the memory cell array, which are used in illustrating the embodiment described below. After the bitlines have been divided into the first group and the second group, a supply voltage (for charging) or a ground voltage (for discharging) is applied to a specific group of bitlines, such that the bitlines are tested based on the feature that a defective bitline cannot be charged or discharged.

Referring to FIG. 1, in an embodiment of the present invention, the testing method comprises the following steps.

First, in step S101, a voltage (such as Vcc) is applied to the first group of bitlines from the first end B of the bitlines to perform a charging process, and a ground voltage (such as Vss) is applied to the second group of bitlines for shielding.

Then, in step S103, the charging process performed on the first group of bitlines is shut down, and the ground voltage is applied to the bitlines from the second end T thereof to perform a discharging process on the bitlines, wherein all the bitlines are discharged during the discharging process. The discharging process is usually performed continuously for a short period of time in order to discharge the bitlines completely. The discharging process does not have any effect on any bitlines having an open-circuit (severed) defect. Therefore, any bitlines having an open-circuit (severed) defect can be detected.

Then, in step S105, the status of each of the bitlines in the first group is identified based on a voltage level of the first group of bitlines, wherein, if the voltage level of one of the bitlines in the first group is identified not the ground voltage Vss, it will be determined that the bitline has an open-circuit (severed) defect; conversely, if the voltage level of the first group of bitlines is identified to be the ground voltage Vss, it will be determined that the first group of bitlines does not have any open-circuit (severed) defect.

Then, in step S107, the supply voltage Vcc is applied to the second group of bitlines from the second end T of the bitlines to perform a charging process, and the ground voltage Vss is applied to the first group of bitlines from the first end B of the bitlines to perform a discharging process. At the end of the charging and discharging processes, the process flow of the testing method goes to step S109.

In step S109, the discharging process which is otherwise performed on the first group of bitlines is shut down. In this step, the charging process performed on the second group of bitlines continues for a short period of time to completely charge the adjacent first group of bitlines having a short-circuit defect. The bitlines having a short-circuit defect are charged again by the uninterrupted charging process, such that the bitlines having a short-circuit defect can be detected.

Then, in step S111, the status of each of the bitlines in the first group is identified based on a voltage level of the first group of bitlines, wherein, if the voltage level of the first group of bitlines is identified to be the supply voltage Vcc, it will be determined that the bitlines have developed a short circuit with an adjacent bitline and therefore has a short-circuit defect. The first group of bitlines has the supply voltage Vcc, because the first group of bitlines is continuously charged by the charging process performed on the adjacent second group of bitlines connected thereto by a short circuit, and therefore the voltage level of the first group of bitlines is identified not the ground voltage; conversely, if the voltage level of the bitlines is identified to be the ground voltage Vss, it will be determined that the bitlines do not have any short-circuit defect.

The steps S101, S103, S105 together make an open-circuit bitline test. The steps S107, S109, S111 together make a short-circuit bitline test.

Accordingly, a short-circuit or open-circuit status of the first group of bitlines can be detected. To test the second group of bitlines, all the testing method needs to do is to interchange the first group of bitlines and the second group of bitlines during the above steps.

Referring to FIG. 2, there is shown a block diagram of a non-volatile memory device 100. As shown in FIG. 2, which is intended to be concise and schematic, the non-volatile memory device 100 comprises a memory cell array 110, a page buffer circuit 120, a bitline selection circuit 130, a word-line selection circuit 140, and a control circuit 160, which are connected as shown in the diagram. The control circuit 160 controls the page buffer circuit 120 and the bitline selection circuit 130, and controllably determines whether to supply power to the memory cell array 110 for executing the testing method. An existing circuit in the memory cell array 110 supplies the supply voltage Vcc to a bitline group selected by the bitline selection circuit 130. The control circuit 160 controllably determines whether a voltage is supplied to bitlines from the second end (upper end T) or from the first end (lower end B).

Referring to FIG. 3, there is shown a schematic view of a bitline status according to an embodiment of the present invention. FIG. 3 is exemplified by 10 bitlines, and is exemplified by every two bitlines connected to a page buffer PB, wherein the 4th bitline has an open-circuit defect, whereas the 7th and 8th bitlines have a short-circuit defect. In practice, each page buffer PB can be coupled to one bitline, two bitlines, three bitlines, or more.

FIG. 3 is illustrated with the two groups of bitlines under test. The even-numbered bitlines (the 2nd, 4th, 6th, 8th, and 10th bitlines) are the first group of bitlines. The odd-numbered bitlines (the 1st, 3rd, 5th, 7th, and 9th bitlines) are the second group of bitlines. Direction T refers to the second end. Direction B refers to the first end.

First, the first group of bitlines (the 2nd, 4th, 6th, 8th, and 10th bitlines) are charged from the first end B, and the second group of bitlines (the 1st, 3rd, 5th, 7th, and 9th bitlines) are discharged from the first end B and/or the second end T; meanwhile, charge accumulates on the 4th bitline at a portion thereof near the first end B, but charge does not accumulate on the 8th bitline (as charge escapes from the 7th bitline.)

Then, the charging process performed on the first group of bitlines (the 2nd, 4th, 6th, 8th, and 10th bitlines) is shut down, and all the bitlines (the 1st through 10th bitlines) are discharged from the second end T. Since the discharging process starts from the second end T, the charge that accumulates on the 4th bitline at a portion thereof near the first end B remains unabated. The 8th bitline still does not have any charge accumulated thereon.

Then, the voltage level of the 4th bitline is the supply voltage Vcc, whereas the voltage level of the other bitlines in the first group (the 2nd, 6th, 8th, and 10th bitlines) is the ground voltage Vss. Therefore, the page buffer PB locks and keeps the present status. For example, the logical value in the page buffer PB connected to the 4th bitline is set to 1, and the logical value in the other page buffers PB is set to 0.

Then, the second group of bitlines (the 1st, 3rd, 5th, 7th, and 9th bitlines) is charged from the second end T, and the first group of bitlines (the 2nd, 4th, 6th, 8th, and 10th bitlines) is discharged from the first end B; meanwhile, charge does not accumulate on the 8th bitline, because charge moves in through the 7th bitline and moves out through the first end B.

Then, the discharging process which is otherwise performed on the first group of bitlines (the 2nd, 4th, 6th, 8th, and 10th bitlines) is shut down; meanwhile, although the discharging process has been shut down, the second group of bitlines (the 1st, 3rd, 5th, 7th, and 9th bitlines) is still being charged. Therefore, charge moves from the 7th bitline to the 8th bitline and therefore accumulates on the 8th bitline.

Then, the voltage level of the 8th bitline is the supply voltage Vcc, whereas the voltage level of the other bitlines in the first group (the 2nd, 4th, 6th, and 10th bitlines) is the ground voltage Vss. Therefore, the page buffer PB locks and keeps the present status. For example, the logical value in the page buffer PB connected to the 8th bitline is set to 1, and the logical value in the other page buffers PB is set to 0. The page buffer PB which has been set to 1 remains unchanged. Accordingly, the testing method determines quickly whether the first group of bitlines has an open-circuit defect or a short-circuit defect and dispenses with a lengthy programmed/erasing process.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A method of testing bitlines in a non-volatile memory device, the non-volatile memory device comprising a memory cell array and a plurality of bitlines crossing the memory cell array, the bitlines each having a first end and a second end, the bitlines being divided into a first group and a second group, the testing method comprising the steps of:

supplying a supply voltage to the first group of bitlines from the first end of the bitlines to perform a charging process, and applying a ground voltage to the second group of bitlines;

shutting down the charging process which is otherwise performed on the first group of bitlines, and applying the ground voltage to the bitlines from the second end thereof to perform a discharging process;

identifying a status of each of the bitlines in the first group based on a voltage level of the first group of bitlines, wherein, if the voltage level of one of the bitlines in the first group is identified not the ground voltage, it will be determined that the bitline has an open-circuit defect;

applying the supply voltage to the second group of bitlines from the second end of the bitlines to perform the charging process, and applying the ground voltage to the first group of bitlines from the first end of the bitlines to perform the discharging process;

shutting down the discharging process which is otherwise performed on the first group of bitlines; and identifying the status of each of the bitlines in the first group based on a voltage level of the first group of bitlines, wherein, if the voltage level of the bitlines is identified not the ground voltage, it will be determined that the bitlines have developed a short circuit with the adjacent bitlines and have a short-circuit defect.

2. The testing method of claim 1, wherein the first group of bitlines is defined as including the odd-numbered bitlines and therefore the second group of bitlines is defined as including the even-numbered bitlines, and vice versa.

3. The testing method of claim 1, wherein the first end of the bitlines receives a voltage applied to a page buffer circuit of the non-volatile memory device, and a data as to whether the bitlines have an open-circuit defect is stored in the page buffer circuit.

4. The testing method of claim 1, further comprising the steps of:

applying the supply voltage to the second group of bitlines from the first end of the bitlines to perform the charging process, and applying the ground voltage to the first group of bitlines to perform the discharging process;

shutting down the charging process which is otherwise performed on the second group of bitlines, and applying the ground voltage to the bitlines from the second end of the bitlines to perform the discharging process;

identifying a status of each of the bitlines in the second group based on a voltage level of the second group of bitlines, wherein, if the voltage level of the bitlines is identified not the ground voltage, it will be determined that the bitlines have an open-circuit defect;

applying the supply voltage to the first group of bitlines from the second end of the bitlines to perform the charging process, and applying the ground voltage to the second group of bitlines from the first end of the bitlines to perform the discharging process;

shutting down the discharging process which is otherwise performed on the second group of bitlines; and identifying the status of each of the bitlines in the second group based on a voltage level of the second group of bitlines, wherein, if the voltage level of the bitlines is identified not the ground voltage, it will be determined that the bitlines have developed a short circuit with the adjacent bitlines and have a short-circuit defect.

\* \* \* \* \*